United States Patent
Rangan et al.

(10) Patent No.: US 10,446,229 B2
(45) Date of Patent: *Oct. 15, 2019

(54) MULTISTAGE SET PROCEDURE FOR PHASE CHANGE MEMORY

(71) Applicant: Intel Corporation, Santa Clara, CA (US)

(72) Inventors: Sanjay Rangan, Boise, ID (US); Kiran Pangal, Fremont, CA (US); Nevil N Gajera, Meridian, ID (US); Lu Liu, Boise, ID (US); Gayathri Rao Subbu, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/894,822

(22) Filed: Feb. 12, 2018

(65) Prior Publication Data

US 2018/0182456 A1 Jun. 28, 2018

Related U.S. Application Data

(63) Continuation of application No. 15/442,594, filed on Feb. 24, 2017, now Pat. No. 9,892,785, which is a
(Continued)

(51) Int. Cl.
*G11C 11/16* (2006.01)
*G11C 13/00* (2006.01)
(Continued)

(52) U.S. Cl.
CPC ............ *G11C 13/0069* (2013.01); *G11C 7/04* (2013.01); *G11C 11/16* (2013.01);
(Continued)

(58) Field of Classification Search
CPC ........................ G11C 13/0069; G11C 11/16
(Continued)

(56) References Cited

U.S. PATENT DOCUMENTS

| 4,658,121 A | 4/1987 | Horsma et al. |
| 5,318,661 A * | 6/1994 | Kumomi ................. C30B 1/023 117/8 |

(Continued)

FOREIGN PATENT DOCUMENTS

JP         12009141         12/2012

OTHER PUBLICATIONS

English Translation of Search Report of R.O.C. Patent Application No. 105105917, dated Jan. 25, 2017, 1 page.
(Continued)

*Primary Examiner* — Michael T Tran
(74) *Attorney, Agent, or Firm* — Compass IP Law PC

(57) ABSTRACT

Phase change material can be set with a multistage set process. Set control logic can heat a phase change semiconductor material (PM) to a first temperature for a first period of time. The first temperature is configured to promote nucleation of a crystalline state of the PM. The control logic can increase the temperature to a second temperature for a second period of time. The second temperature is configured to promote crystal growth within the PM. The nucleation and growth of the crystal set the PM to the crystalline state. The multistage ramping up of the temperature can improve the efficiency of the set process relative to traditional approaches.

20 Claims, 6 Drawing Sheets

Related U.S. Application Data continuation of application No. 14/672,130, filed on Mar. 28, 2015, now Pat. No. 9,583,187.

(51) Int. Cl.
*G11C 7/04* (2006.01)
*H01L 45/00* (2006.01)

(52) U.S. Cl.
CPC ...... *G11C 13/0004* (2013.01); *G11C 13/0061* (2013.01); *H01L 45/06* (2013.01); *H01L 45/1286* (2013.01); *H01L 45/141* (2013.01); *G11C 2013/008* (2013.01); *G11C 2013/0078* (2013.01); *G11C 2013/0092* (2013.01)

(58) Field of Classification Search
USPC .................................................. 365/158, 163
See application file for complete search history.

(56) References Cited

U.S. PATENT DOCUMENTS

| | | | |
|---|---|---|---|
| 6,169,013 B1 | 1/2001 | Voutsas | |
| 6,452,891 B1 | 9/2002 | Hennessey | |
| 7,964,468 B2 | 6/2011 | Lung et al. | |
| 8,363,458 B2 | 1/2013 | Lowrey | |
| 8,420,526 B2 | 4/2013 | Gutsche et al. | |
| 10,062,845 B1* | 8/2018 | Gee | H01L 45/1608 |
| 2004/0178402 A1 | 9/2004 | Ovshinsky et al. | |
| 2005/0152178 A1* | 7/2005 | Katti | G11C 11/16 365/157 |
| 2006/0054506 A1* | 3/2006 | Natan | B22F 1/0025 205/112 |
| 2006/0181931 A1 | 8/2006 | Ha et al. | |
| 2006/0186443 A1 | 8/2006 | Hosobuchi | |
| 2008/0265449 A1 | 10/2008 | Meinders et al. | |
| 2009/0116280 A1 | 5/2009 | Parkinson et al. | |
| 2009/0302293 A1 | 12/2009 | Morikawa et al. | |
| 2010/0080036 A1* | 4/2010 | Liu | G11C 11/16 365/145 |
| 2010/0182827 A1 | 7/2010 | Kostylev et al. | |
| 2011/0012082 A1 | 1/2011 | Castro | |
| 2011/0084240 A1 | 4/2011 | Schell et al. | |
| 2012/0069622 A1 | 3/2012 | Parkinson et al. | |
| 2012/0250403 A1 | 10/2012 | Wang et al. | |
| 2012/0294074 A1 | 11/2012 | Hurkx et al. | |
| 2013/0322151 A1 | 12/2013 | Allenspach et al. | |
| 2013/0336054 A1 | 12/2013 | Parkinson | |
| 2014/0117302 A1 | 5/2014 | Goswami | |
| 2014/0275611 A1 | 9/2014 | Bond et al. | |
| 2015/0158080 A1 | 6/2015 | O'keeffe et al. | |
| 2015/0263069 A1* | 9/2015 | Jo | H01L 45/085 365/148 |
| 2015/0292111 A1* | 10/2015 | Grunder | C30B 29/406 257/615 |
| 2015/0294716 A1 | 10/2015 | Tortorelli et al. | |
| 2016/0012888 A1* | 1/2016 | Pirovano | G11C 13/0069 365/163 |
| 2016/0017515 A1* | 1/2016 | Han | C30B 25/16 117/95 |
| 2016/0104544 A1* | 4/2016 | Schafer | G11C 7/04 374/141 |
| 2016/0141031 A1* | 5/2016 | Manipatruni | G06F 12/0246 711/103 |
| 2016/0159682 A1 | 6/2016 | Borczuch-Laczka et al. | |
| 2016/0254050 A1 | 9/2016 | Pirovano et al. | |
| 2017/0069366 A1 | 3/2017 | Furuhashi et al. | |
| 2017/0372791 A1* | 12/2017 | Hatsuda | G11C 29/785 |
| 2018/0151212 A1* | 5/2018 | Lim | G11C 11/1693 |
| 2019/0080738 A1* | 3/2019 | Choi | G11C 11/14 |
| 2019/0147929 A1* | 5/2019 | Sasaki | G11C 11/16 |
| 2019/0157549 A1* | 5/2019 | Sun | H01L 43/02 |

OTHER PUBLICATIONS

International Search Report and Written Opinion for PCT Patent Application No. PCT/US2016/021164, dated Mar. 7, 2016, 15 pages.
Summary of KR Office Action, Patent Application No. 10-2016-0022645, dated Sep. 12, 2017 1 page.

\* cited by examiner

US 10,446,229 B2

MULTISTAGE SET PROCEDURE FOR PHASE CHANGE MEMORY

PRIORITY

This application is a Continuation of, and claims the benefit of priority of, U.S. application Ser. No. 15/442,594, filed Feb. 24, 2017, now U.S. Pat. No. 9,892,785, which in turn is a Continuation of and claims the benefit of priority of, U.S. application Ser. No. 14/672,130, filed Mar. 28, 2015, now U.S. Pat. No. 9,583,187.

FIELD

Embodiments of the invention are generally related to phase change materials, and more particularly to a multistage set procedure for setting a phase change material state.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2015, Intel Corporation, All Rights Reserved.

BACKGROUND

Memory resources have innumerable applications in electronic devices and other computing environments. Continued drive to smaller and more energy efficient devices has resulted in scaling issues with traditional memory resources that are based on using electron charges for data storage and access. Phase change materials (PM) are based on the property of certain compounds to take on one of two or more states based on heat applied to the material. PMs have been made of chalcogenide materials, which exhibit at least two states: a structured crystalline state and a non-ordered amorphous state, depending on characteristics of the application of heat to the material. PMs offer potential advantages for use in memory in that they are nonvolatile, and can potentially scale smaller due to the storage and access of data being based on the structure of the material state instead of on electron charge.

However, access performance in memories based on PMs has historically been significantly worse than that of established memory technologies. Recently, read latency has improved to be comparable to other memory technologies, but write latency continues to result in significant delays. Write latency in phase change memories (PCM) is primarily limited by the set pulse to crystallize or set the PM from its reset or amorphous state. Traditional set algorithms use a fixed ramp rate for either a ramp down approach (first heat the material to the amorphous state, and control the cooling to attempt to change to the crystalline state), or a ramp up approach (controlled increase in temperature to attempt to promote crystallization). These approaches or set procedures attempt to ensure that all memory cells experience an optimal set temperature to minimize the set latency/duration.

Both ramp up and ramp down approaches perform reasonably well in cells with unconfined PM, but are not effective in cells having fully amorphized PM. An unconfined PM refers to a PM that is not fully amorphized in the reset state, and thus always includes crystal nuclei or crystalline region. Thus, the set process is dominated only by crystal growth to transform the amorphous region(s) to the crystalline state based on the nuclei already present. However, to scale PM-based memories to smaller size, cost, and power consumption, the cell size must be decreased. Seeing that the extent to which the cell becomes fully amorphized correlates with PM thickness and/or area of the cell, scaling PM-based memories to smaller geometries results in memory cells that will not set efficiently by traditional set procedures. Thus, traditional set procedures require confined cells to grow crystal, and scaling to smaller geometries reduces the number of nuclei or the amount of crystalline area, which increases set times. The PM will not properly transition to the crystalline state when there are insufficient nuclei or a sufficient crystalline region to promote crystal growth. Thus, traditional set procedures result in very long set procedures, negatively impacting write latency, and/or result in cells that are not set effectively, resulting in higher bit error rate (BER).

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
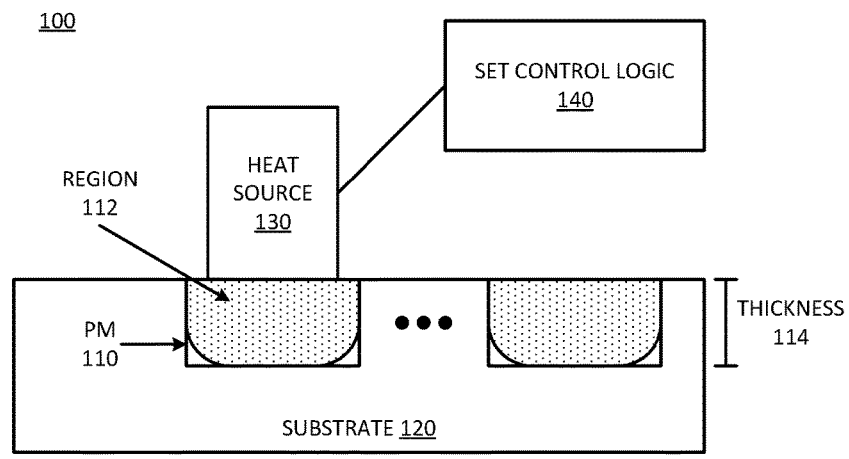
FIG. 1 is an embodiment of a block diagram of a system that applies a multistage phase change set procedure.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a phase change material (PM) is set with a multistage set procedure. Set control logic can heat the PM to a first temperature for a first period of time. The first temperature is configured to promote nucleation of a crystalline state of the PM. The control logic can increase the temperature to a second temperature for a second period of time. The second temperature is configured to promote crystal growth within the PM. The nucleation and growth of the crystal set the PM to the crystalline state. The multistage ramping up of the temperature separates nucleation and growth stages in the set procedure. Such a multistage procedure can improve the efficiency of the set process relative to traditional approaches.

Thus, the crystallization set process includes at least two different stages: a nucleation stage to generate crystalline nuclei; and, a crystal growth stage to promote crystal growth from those nuclei. Typically, nucleation which is a stochastic process and occurs at a much slower rate, has a peak at lower temperature relative to crystal growth, which is typically orders of magnitude higher rate with peaks at a higher temperature. As used herein, a multistage set procedure refers to a procedure in which different discrete temperatures are applied (e.g., through the controlled application of current and/or light) and held constant for a period of time before changing the temperature. Thus, in one embodiment, each time the temperature is held constant for a period of time can be considered the different stages of the set procedure. Multistage application of temperature or heat to a PM can provide an isothermal condition to allow the different material state changes to occur (nucleation and/or crystal growth). By holding the temperature constant, the efficiency of the state change can improve, which increases the overall efficiency of the system. The multiple stages of the set procedure described herein can thus provide significant improvement over a constant ramp-up or ramp-down set procedure.

In one embodiment, the system applies the temperature differences through joule heating by applying varying amounts of current to the PM to heat the material. It will be understood that the specific values of current used for joule heating may vary by material. As described herein, a set procedure includes a nucleation stage at a lower temperature to generate crystal nuclei, followed by a higher temperature stage to complete the crystal growth. In terms of joule heating via application of a current, the set procedure can be executed via a lower amplitude current pulse to initiate the crystallization process through crystal nuclei generation, followed by a higher amplitude current pulse to complete the crystallization process and accelerate the crystal growth.

A multistage set procedure has different stages, where a temperature and/or a current is held substantially constant for a period of time, followed by another temperature and/or current is held substantially constant for another period of time. Such a multistage approach is contrasted from a continuous ramp up or down with a constant ramp rate on the current and/or the temperature. By continuously ramping, there is no stage at which temperature and/or current is held constant for a period of time. The multistage set procedure with a nucleation/seed stage followed by a growth stage has been evaluated to provide better than a 2× gain in write latency or better than a 2× gain in BER (bit error rate) relative to continuous ramping set procedures. By separating the set procedure into different stages, the set procedure can enable specific stages to optimize nucleation and growth separately with settings and times depending on the underlying PM predisposition (e.g., the composition of differing PMs). Traditional ramping approaches are generally inflexible, and assume a PM behavior. Modifications of the traditional set algorithms will result in longer set times, and are very limited on what can be modified (e.g., slope of the ramp may be modifiable in some cases). It will be understood that "optimization" as used herein is not an absolute term, and refers to a maximum efficiency given a set of conditions, or a best performance within specified tolerances, or an approximation of a theoretical best calculation based on an iterative approach. Optimization does not mean that improvement cannot be made in an absolute sense.

Reference to memory devices can apply to different memory types. Memory devices generally refer to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (dual data rate version 3, original release by JEDEC (Joint Electronic Device Engineering Council) on Jun. 27, 2007, currently on release 21), DDR4 (DDR version 4, initial specification published in September 2012 by JEDEC), LPDDR3 (low power DDR version 3, JESD209-3B, August 2013 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), WIO3 (Wide I/O 3, currently in discussion by JEDEC), HBM2 (HBM version 2), currently in discussion by JEDEC), and/or others, and technologies based on derivatives or extensions of such specifications.

In addition to, or alternatively to, volatile memory, in one embodiment, reference to memory devices can refer to a nonvolatile memory device whose state is determinate even if power is interrupted to the device. In one embodiment, the nonvolatile memory device is a block addressable memory device, such as NAND or NOR technologies. Thus, a memory device can also include a future generation nonvolatile devices, such as a three dimensional crosspoint memory device, or other byte addressable nonvolatile memory device. In one embodiment, the memory device can be or include multi-threshold level NAND flash memory, NOR flash memory, single or multi-level Phase Change Memory (PCM) or phase change random access memory (PRAM), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory. In one embodiment, different memory technologies can be applied to the different memory standard mentioned above.

FIG. 1 is an embodiment of a block diagram of a system that applies a multistage phase change set procedure. System 100 includes substrate 120 in which PM 110 is disposed. In one embodiment, substrate 120 is a semiconductor substrate in which a semiconductor PM material is processed as a memory cell. In one embodiment, substrate 120 is a plastic or other material on which a chalcogenide glass or other PM is disposed as a storage medium. PM 110 has a thickness 114 that allows the cell size to be scaled down for denser bit arrays or memory cell arrays.

Due to thickness 114, PM 110 is a fully amorphized material in a reset state. Reference to a "fully" amorphized material does not necessarily mean that every bit of PM material deposited or otherwise processed on substrate 120 is amorphous in the reset state. Rather, fully amorphized can refer to all active area in the PM being amorphous, as illustrated by region 112. Region 112 may or may not completely include all phase change material in PM 110 (as illustrated by the shaded region not coming all the way out to the corners). Rather, region 112 is fully amorphized in that it does not include sufficient nuclei to promote crystal growth without first seeding the crystal growth. System 100 and other figures herein are not necessarily drawn to scale.

The amount of crystal nuclei that are needed to promote growth will be different for different PMs. Generally, crystal growth occurs much faster than nucleation, and at a significantly higher temperature. The crystalline or set state of PM 110 is highly ordered and has a low resistance and high reflectivity. The amorphous or reset state of PM 110 is disordered and has a much higher resistance and lower reflectivity relative to the crystalline state. The state of PM 110 can thus be read via either determining the resistance of the material or via refractivity of light. Thus, PM 110 can be, for example, a PRAM or PCM or optical spinning disk, or other memory.

Heat source 130 represents a source of heat for PM 110. In one embodiment, when PM 110 is integrated onto an I/C (integrated circuit), such as for a PCM application, heat source 130 can include a terminal or resistive element adjacent a memory cell or other I/C component that will create heat when current is applied to the circuit. In one embodiment, heat source 130 can alternatively be a light source (e.g., a laser) that creates heat optically. In some respects, in certain circuit applications, the resistive element could be an optical circuit seeing that it produces more light and more heat as more current is conducted. Thus, in one embodiment, heat source 130 is integrated adjacent PM 110 and is local to PM 110. In one embodiment, heat source 130 is remote from PM 110, and includes a laser or other electromagnetic wave source to transmit with varying intensity on PM 110.

Set control logic 140 represents a circuit that controls the operation of heat source 130. In one embodiment, logic 140 is integrated on a common I/C as PM 110. In one embodiment, logic 140 is integrated on a common substrate 120 with PM 110. Logic 140 applies control to cause heat source 130 to heat PM 110 in different stages. Logic 140 controls the heating of PM 110 via heat source 130 to first promote nucleation, and then to promote crystal growth from the nuclei generated. In one embodiment, logic 140 separates the nucleation and/or the growth stages into one or more sub-stages.

Figure 2:
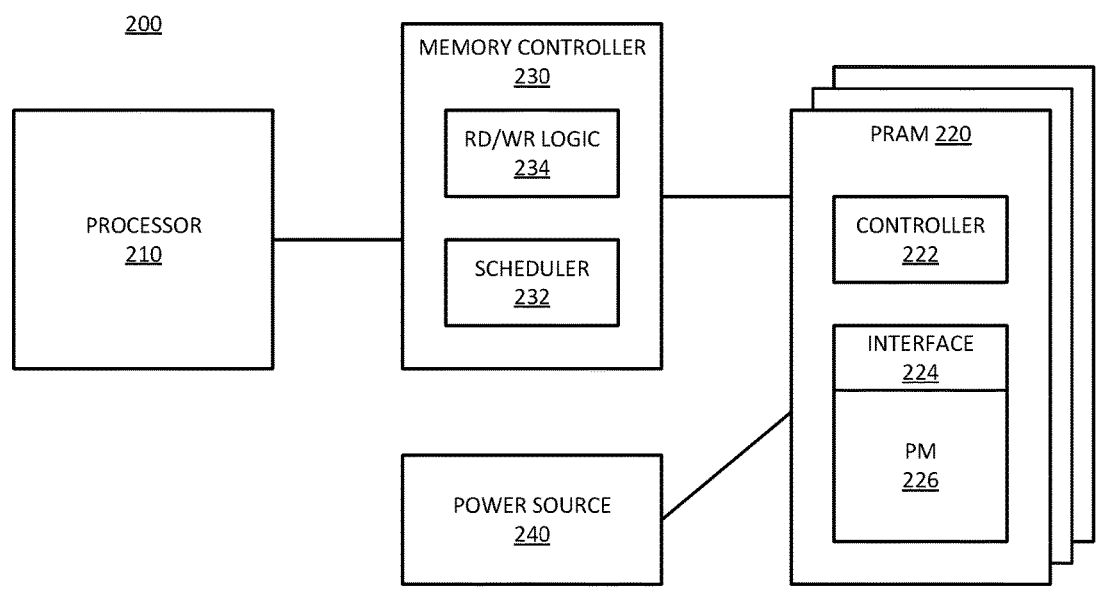
FIG. 2 is an embodiment of a block diagram of a system that applies a multistage phase change set procedure with a current based heat source.

FIG. 2 is an embodiment of a block diagram of a system that applies a multistage phase change set procedure with a current based heat source. In one embodiment, system 200 is one example of system 100 of FIG. 1. System 200 represents components of a memory subsystem having phase change random access memory (PRAM) 220 to store and provide data in response to operations of processor 210. System 200 receives memory access requests from a host or a processor 210, which is processing logic that executes operations based on data stored in PRAM 220 or generates data to store in PRAM 220. Processor 210 can be or include host processor, central processing unit (CPU), microcontroller or microprocessor, graphics processor, peripheral processor, application specific processor, or other processor, whether single core or multicore processor.

System 200 includes memory controller 230, which represents logic to interface with PRAM 220 and manage access to data stored in the memory. In one embodiment, memory controller 230 is integrated into the hardware of processor 210. In one embodiment, memory controller 230 is standalone hardware, separate from processor 210. Memory controller 230 can be a separate circuit on a substrate that includes the processor. Memory controller 230 can be a separate die or chip integrated on a common substrate with a processor die (e.g., as a system on a chip (SoC)). In one embodiment, at least some of PRAM 220 can be included on an SoC with memory controller 230 and/or processor 210.

In one embodiment, memory controller 230 includes read/write logic 234, which includes hardware to interface with PRAM 220. Logic 234 enables memory controller 234 to generate read and write commands to service requests for data access generated by the execution of instructions by processor 210. In one embodiment, memory controller 230 includes scheduler 232 to schedule the sending of access commands to PRAM 220 based on known timing parameters for read and write access for PRAM 220. Known timing parameters can be those that are preprogrammed or otherwise preconfigured into system 200. Such parameters can be stored in PRAM 220 and accessed by memory controller 230. In one embodiment, at least some parameters are determined by synchronization procedures. The timing parameters can include the timing associated with write latency for PRAM 220. The write latency of PRAM 220 is determined by the ability of PRAM 220 to change the state of bits of its memory array from amorphous to crystalline, in accordance with any embodiment described herein.

The memory resources or memory array or cachelines in PRAM 220 are represented by PM 226, which includes phase change material used as memory cells, where the memory cells are fully amorphized in the reset state. PRAM 220 includes interface logic 224 to control the access to PM 226. Interface 224 can include decode logic, including logic to address specific rows or columns or bits of data. In one embodiment, interface 224 includes logic to control the amount of current provided to specific memory cells of PM 226. Thus, control over writing PM 226 can occur through driver and/or other access logic of interface 224. Controller 222 represents an on-die controller on PRAM 220 to control its internal operations to execute commands received from memory controller 230. For example, controller 222 can control any of timing, addressing, I/O (input/output) margining, scheduling, and error correction for PRAM 220.

In one embodiment, controller 222 is configured to write PM 226 in accordance with any embodiment described herein with separate nucleation and growth phases. Thus, controller 222 can control the operation of interface 224 to provide current through cells to be written, thus heating up the cells in stages to write the cells. System 200 includes power source 240, which can be a voltage source or regulator that provides power to PRAM 220. Controller 222 and interface 224 use the power available from power source 240 to heat up cells within PM 226 to write data, including putting selected cells in a crystalline state in accordance with any embodiment described herein. In one embodiment, controller 222 and interface 224 can be considered a control circuit that heats PM 226 to a first temperature for a first period of time controlled by controller 222. The first temperature and the first period of time promote nucleation of a crystalline state of PM 226. Controller 222 then causes interface 224 to conduct more current and increase the temperature of PM 226 from the first temperature to a second temperature for a second period of time. The second temperature and the second period of time promote crystal growth within PM 226 to set the PM to the crystalline state. In one embodiment, controller 222 and interface 224 pass the current through PM 226 to heat it up, in addition to passing it through other interface hardware.

Figure 3:
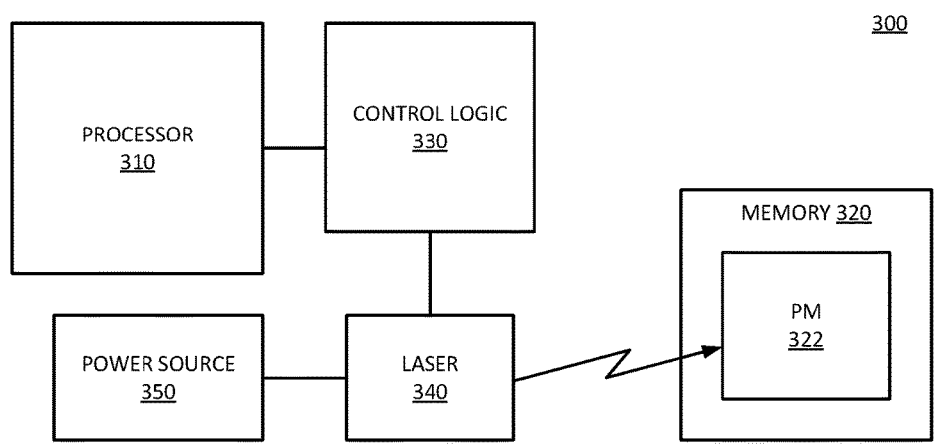
FIG. 3 is an embodiment of a block diagram of a system that applies a multistage phase change set procedure with a light based heat source.

FIG. 3 is an embodiment of a block diagram of a system that applies a multistage phase change set procedure with a light based heat source. In one embodiment, system 300 is one example of system 100 of FIG. 1. System 300 represents components of a memory subsystem with memory 320 that has phase change material PM 322 to store and provide data in response to operations of processor 310. System 300 receives memory access requests from a host or a processor 310, which can be any processor such as that described with respect to processor 210 of system 200. In one embodiment, processor 310 can execute operations based on data stored in memory 320 or generate data to store in memory 320.

In one embodiment, system 300 includes control logic 330 to control writes to memory 320. In one embodiment, control logic 330 is or is part of a memory controller. In one embodiment, control logic 330 is integrated into the hardware of processor 310, or on a same substrate as processor 310, or as part of an SoC with processor 310. In one embodiment, control logic 330 controls access to memory 320 via laser 340, for example, when memory 320 is written optically.

In one embodiment, system 300 includes laser 340 to optically heat cells or bits or portions of PM 322. Laser 340 uses power from power source 350 to control the intensity (energy per unit area) of light produced. Based on controlling the intensity of laser 340, control logic 330 can write PM 332 in accordance with any embodiment described herein with separate nucleation and growth phases. Thus, control logic 330 can control the operation of laser 340 to irradiate selected portions of PM 322 to write data to memory 320, including putting selected portions in a crystalline state in accordance with any embodiment described herein. In one embodiment, control logic 330 and laser 340 can be considered a control circuit that heats PM 322 to a first temperature for a first period of time controlled by control logic 330. The first temperature and the first period of time promote nucleation of a crystalline state of PM 332. Control logic 330 then causes laser 340 to increase the intensity of light to increase the temperature of PM 332 from the first temperature to a second temperature for a second period of time. The second temperature and the second period of time promote crystal growth within PM 322 to set the PM to the crystalline state.

Figure 4:
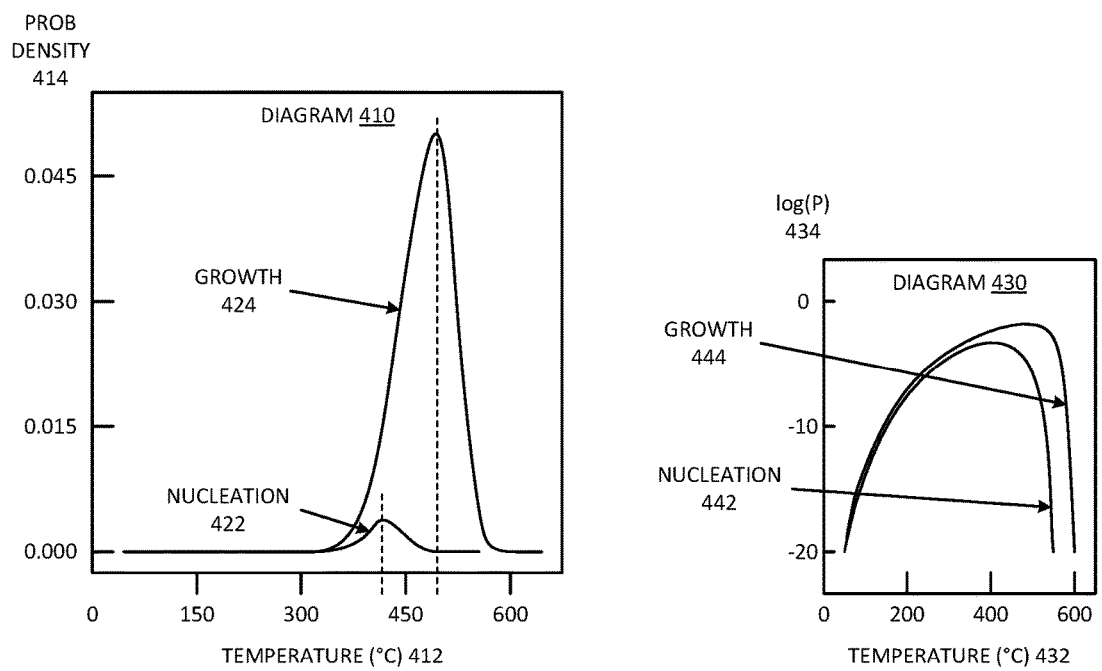
FIG. 4 a diagrammatic representation of an embodiment of phase change material nucleation and growth versus temperature.

FIG. 4 a diagrammatic representation of an embodiment of phase change material nucleation and growth versus temperature. Diagrams 410 and 430 provide basis for separating the heating of PM material into multiple stages to transition the PM to a crystalline state. Diagram 410 illustrates probability density 414 plotted against temperature 412. Diagram 410 includes two curves: curve 422 illustrating the probability density of nucleation as temperature changes, and curve 424 illustrating the probability density of crystal growth as temperature changes.

As mentioned previously, traditional approaches to heating PMs to transition to crystalline state assumes that crystal nuclei already exist in the PM. Thus, the algorithms focus on growth of the crystal, and the ramping tries to apply the temperature range that maximizes crystal growth. It will be observed that the maximum efficiency for nucleation will be achieved somewhere in the range of 400° C. for the particular PM tested for diagram 410, whereas the maximum efficiency for growth occurs somewhere closer to the range of 500° C. for the PM. It will also be observed that there is overlap within the range of the range of 400-500° C., which allows nucleation and growth to both occur, but will occur at much lower efficiency, which extends the time needed to set the crystalline state. It will be understood that different materials will have different temperatures and temperature ranges. For example, another PM tested is expected to achieve nucleation somewhere in the range of 250° C., with maximum growth occurring somewhere above 300° C. Thus, the example is merely one illustration, and is not limiting. Other materials with other temperature ranges can also be used in accordance with any embodiment of a multistage set procedure described herein.

Diagram 420 illustrates similar information, but on a logarithmic scale. Thus, in one embodiment, diagram 430 illustrates log(P) 434, which is the log of probability density 414, against temperature 432. Curve 442 illustrates nucleation occurring most efficiently around the range of 400° C., and curve 444 illustrates growth occurring most efficiently around the range of 500° C. Thus, it will be understood that performing a set to the crystalline state will benefit with improved efficiency by separating the nucleation and growth phases.

Figure 5:
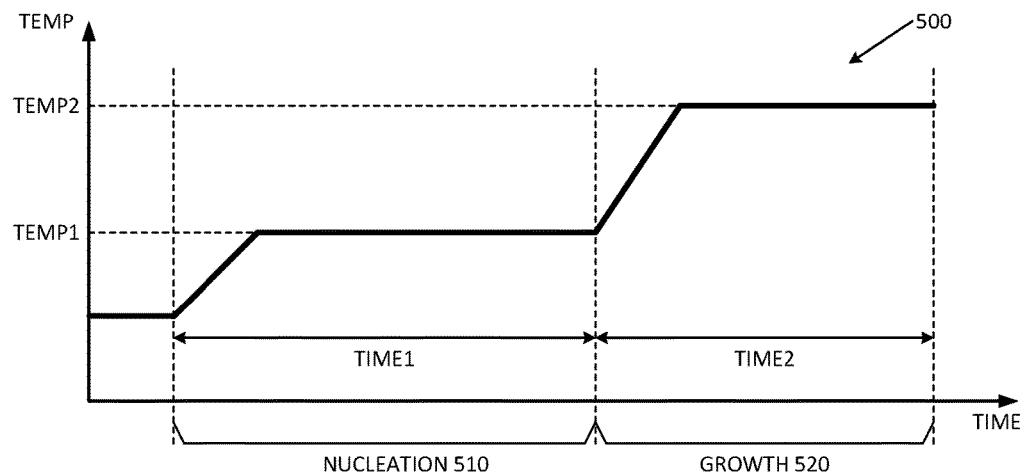
FIG. 5 is a diagrammatic representation of an embodiment of a multistage phase change set procedure.

FIG. 5 is a diagrammatic representation of an embodiment of a multistage phase change set procedure. Diagram 500 represents the effects of operations executed by a control circuit to set a PM to a crystalline state. Diagram 500 can be a diagram of a set procedure in accordance with any embodiment described herein. Nucleation stage 510 includes ramping up to Temp1 for Time1. It will be understood that the ramping time might need to be separately accounted from the time of holding the temperature at Temp1. For example, proper nucleation may require holding the temperature at Temp 1 for Time1, and there is necessarily a ramping time to increase to Temp1. Growth stage 520 includes ramping to Temp2 for Time2. Again, the time for holding Temp2 could be Time2 and the ramping time would need to be separately accounted for.

In one embodiment, Time1 and Time2 are different lengths of time. Typically, nucleation 510 would take longer than growth 520, since growth tends to occur quickly once a critical number of nuclei are present. In one embodiment, nucleation stage 510 includes multiple nucleation sub-stages to account for variations in the PM structure. In one embodiment, the set procedure of diagram 500 could include other stages than what are shown (similar to what is shown in FIG. 6).

Figure 6:
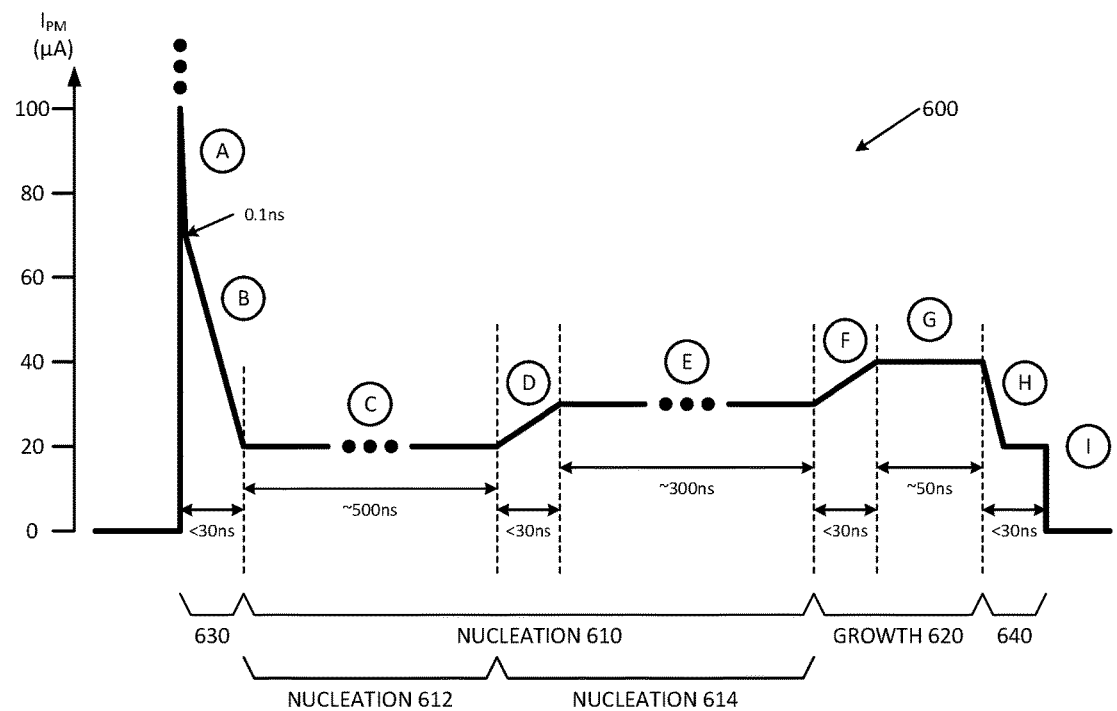
FIG. 6 is a diagrammatic representation of an embodiment of a multistage phase change set procedure with two nucleation stages.

FIG. 6 is a diagrammatic representation of an embodiment of a multistage phase change set procedure with two nucleation stages. Diagram 600 can be one example of a set procedure in accordance with diagram 500 of FIG. 5. Diagram 600 can be a diagram of a current profile for a set procedure in accordance with any embodiment described herein. Diagram 600 illustrates a procedure tested on a specific PM structure in a memory configuration. It will be understood that different memory architectures and/or different PMs can have variations in the values illustrated, although the basic curve of diagram 600 is expected to apply the same.

The curve of diagram 600 will be seen in contrast to historical set algorithms, which either provide a pulse that melts the crystal and then quenches it to allow the crystal to grow, or that continuously ramps up the current and temperature to achieve crystallization. Diagram 600 can be understood as having four different stages, initialization stage 630, nucleation stage 610, growth stage 620, and finalization stage 640. In one embodiment, nucleation 610 is broken into nucleation stages 612 and 614 to account for variation in the optimal seed current or temperature from cell to cell.

In one embodiment, diagram 600 starts with an initial pulse of current at A, which can initially melt the PM. In one embodiment, the current spike at A is minimized to the least amount of current needed to amorphize the PM, which allows the PM to cool back to a lower temperature sooner to start the nucleation stage. In one embodiment, the pulse is limited to below 150 uA for approximately 0.1 ns, where the current will dissipate and the PM cool at B. It is anticipated that the time from the initial pulse to the start of nucleation (i.e., the time for stage 630) will be less than 30 ns.

Nucleation 612 occurs at C, which begins the nucleation at the lowest cell temperature. It will be understood that cells with low nucleation current need a longer nucleation time. Thus, nucleation 612 can have a time on the order of 500 ns, which could vary by up to approximately 100 ns or more. In one embodiment, the expected current of nucleation 612 is approximately 20-30 uA, and can be in the range of 10-50 uA, with a delta of 5 uA. Nucleation 614 is a second nucleation stage at E, after ramping the current at D to increase the temperature of the PM. The ramping at D is expected to take less than 30 ns. In one embodiment, the expected current of nucleation 614 is approximately 30-40 uA, and can be in the range of 10-70 uA, with a delta of 5 uA. In one embodiment, the time of nucleation 614 is approximately 300 ns, which could vary by up to approximately 70 ns or so. Stage 612 starts nucleation, and stage 614 captures the remaining bits in its nucleation distribution, and begins to promote crystal growth.

At F, the control logic ramps the current to increase the temperature to a higher temperature to promote crystal growth at G. The ramping at F is expected to take less than 30 ns. In one embodiment, growth stage 620 is expected to be in the range of approximately 40-60 uA, and be held for a time of approximately 50 ns, and can vary by up to approximately 10 ns. In one embodiment, the set procedure ramps the current down at H to a termination or finalization stage 640 at I. In one embodiment, the expected current range of stage 640 is approximately 20-35 uA, and can be in the range of 10-50 uA, with a delta of 5 uA. In one embodiment, the entire time of transition from the current of growth 620 to the end of finalization stage 640 is up to approximately 30 ns or less. Stage 640 can include a controlled ramp down or step down with a hold at a SET-back current. It will be understood that it is possible for certain areas of a memory cell to become disturbed over the course of growth 620, and melt back to an amorphous state. Stage 640 can provide a short period of lower temperature control to allow the cell to anneal and "heal up" disturbances in the crystal that might occur from random overheating in portions of the crystalline structure.

Figure 7:
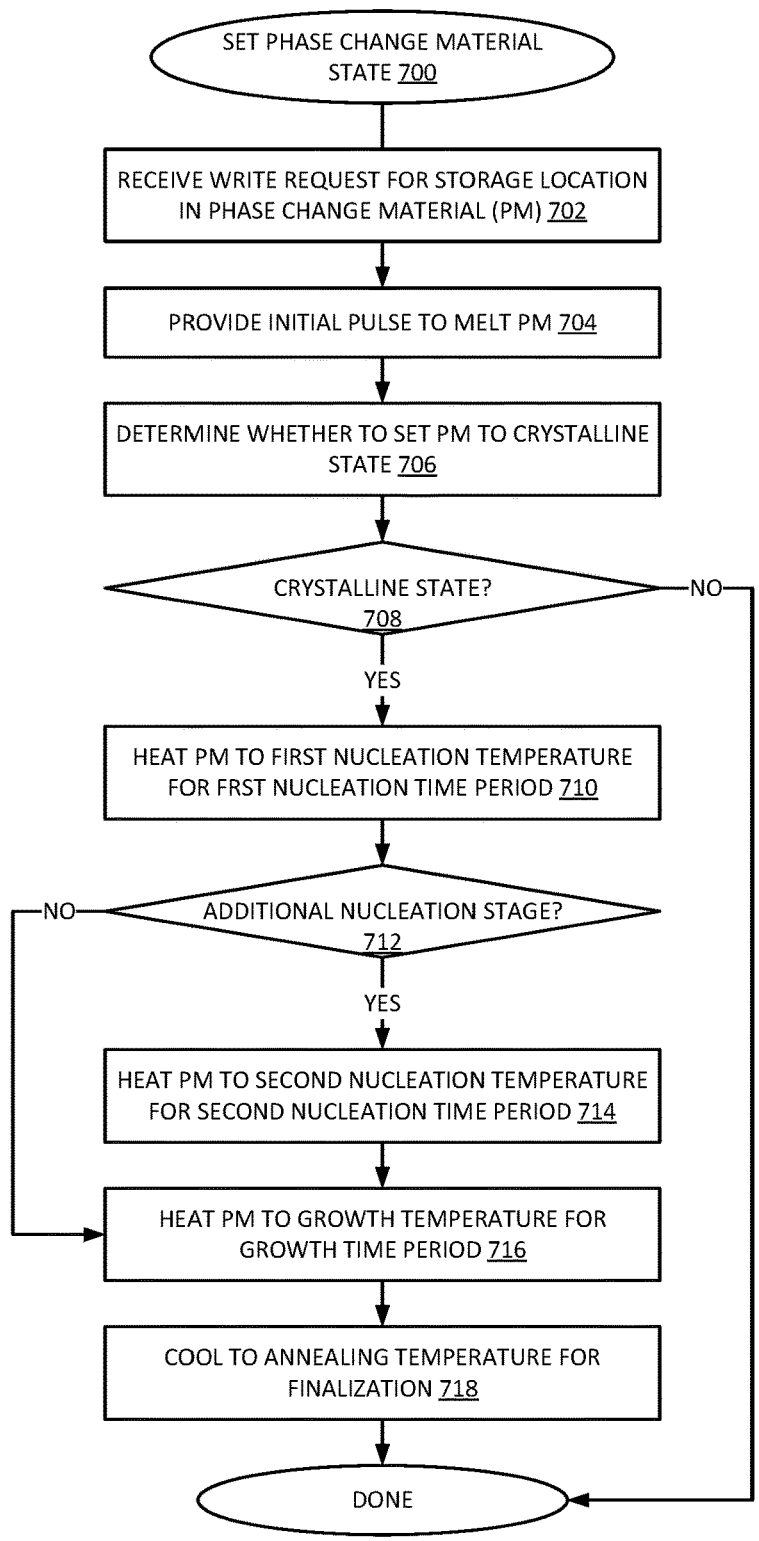
FIG. 7 is a flow diagram of an embodiment of a process for implementing a multistage phase change set procedure.

FIG. 7 is a flow diagram of an embodiment of a process for implementing a multistage phase change set procedure. Process 700 illustrates one embodiment of operations for performing a set for a phase change material in accordance with any embodiment described herein. The set procedure sets the PM to a crystalline or amorphous state to represents a 1 or 0, or logic high and logic low. A controller or control logic writes a data bit by setting the state of the PM. The control logic receives a write request for a specified storage location in a PM from a host or host processor, 702. It will be understood that the PM can be part of storage that is set responsive to an optical signal or part of storage that is set via current or other form of local temperature control.

In one embodiment, the control logic provides an initial pulse to melt the PM, 704. The initial pulse can melt the PM and cause it to be in an amorphous state. In one embodiment, the control logic determines whether to set the PM to a crystalline state or reset the PM to an amorphous state, 706. If the PM is to be reset to amorphous state, 708 NO branch, the procedure can end since the PM is already amorphous.

If the PM is to be set to a crystalline state, 708 YES branch, in one embodiment, the control logic provides controls to heat the PM to a first nucleation temperature for a first nucleation time period, 710. In one embodiment, the procedure supports multiple nucleation stages. While two nucleation stages are illustrated in process 700, it is possible to perform more than two nucleation stages, as well as being possible to perform only a single nucleation stage. Thus, if the control logic is to perform an additional nucleation stage, 712 YES branch, the control logic can perform operations to heat the PM to a second nucleation temperature for a second nucleation period of time, 714.

After completing the nucleation stage, the control logic can heat the PM to a growth temperature for a growth time period, 716. In one embodiment, the control logic performs operations to allow the PM to cool to an annealing temperature to finalize the set procedure. After finalizing the crystallization, the procedure can end.

Figure 8:
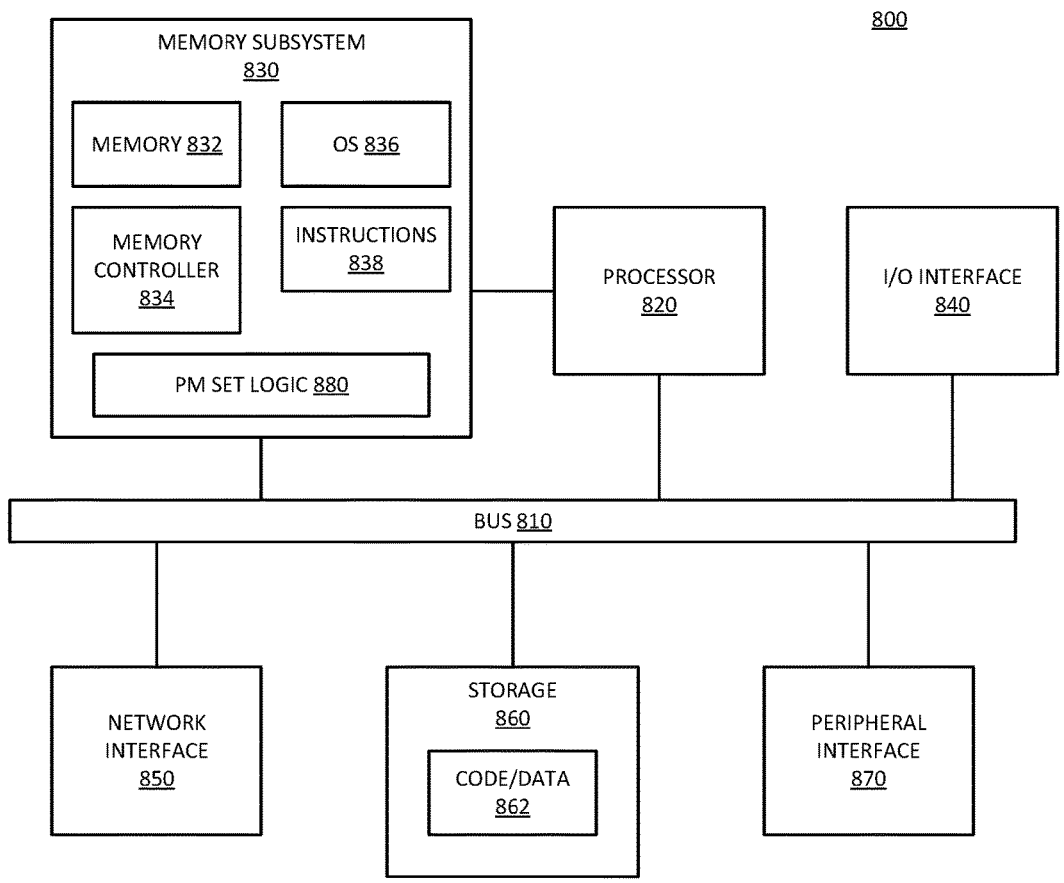
FIG. 8 is a block diagram of an embodiment of a computing system in which a multistage phase change set procedure can be implemented.

FIG. 8 is a block diagram of an embodiment of a computing system in which a multistage phase change set procedure can be implemented. System 800 represents a computing device in accordance with any embodiment described herein, and can be a laptop computer, a desktop computer, a server, a gaming or entertainment control system, a scanner, copier, printer, routing or switching device, or other electronic device. System 800 includes processor 820, which provides processing, operation management, and execution of instructions for system 800. Processor 820 can include any type of microprocessor, central processing unit (CPU), processing core, or other processing hardware to provide processing for system 800. Processor 820 controls the overall operation of system 800, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 830 represents the main memory of system 800, and provides temporary storage for code to be executed by processor 820, or data values to be used in executing a routine. Memory subsystem 830 can include one or more memory devices such as read-only memory (ROM), flash memory, one or more varieties of random access memory (RAM), or other memory devices, or a combination of such devices. Memory subsystem 830 stores and hosts, among other things, operating system (OS) 836 to provide a software platform for execution of instructions in system 800. Additionally, other instructions 838 are stored and executed from memory subsystem 830 to provide the logic and the processing of system 800. OS 836 and instructions 838 are executed by processor 820. Memory subsystem 830 includes memory device 832 where it stores data, instructions, programs, or other items. In one embodiment, memory subsystem includes memory controller 834, which is a memory controller to generate and issue commands to memory device 832. It will be understood that memory controller 834 could be a physical part of processor 820.

Processor 820 and memory subsystem 830 are coupled to bus/bus system 810. Bus 810 is an abstraction that represents any one or more separate physical buses, communication lines/interfaces, and/or point-to-point connections, connected by appropriate bridges, adapters, and/or controllers. Therefore, bus 810 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 810 can also correspond to interfaces in network interface 850.

System 800 also includes one or more input/output (I/O) interface(s) 840, network interface 850, one or more internal mass storage device(s) 860, and peripheral interface 870 coupled to bus 810. I/O interface 840 can include one or more interface components through which a user interacts with system 800 (e.g., video, audio, and/or alphanumeric interfacing). Network interface 850 provides system 800 the ability to communicate with remote devices (e.g., servers, other computing devices) over one or more networks. Network interface 850 can include an Ethernet adapter, wireless interconnection components, USB (universal serial bus), or other wired or wireless standards-based or proprietary interfaces.

Storage 860 can be or include any conventional medium for storing large amounts of data in a nonvolatile manner, such as one or more magnetic, solid state, or optical based disks, or a combination. Storage 860 holds code or instructions and data 862 in a persistent state (i.e., the value is retained despite interruption of power to system 800). Storage 860 can be generically considered to be a "memory," although memory 830 is the executing or operating memory to provide instructions to processor 820. Whereas storage 860 is nonvolatile, memory 830 can include volatile memory (i.e., the value or state of the data is indeterminate if power is interrupted to system 800).

Peripheral interface 870 can include any hardware interface not specifically mentioned above. Peripherals refer generally to devices that connect dependently to system 800. A dependent connection is one where system 800 provides the software and/or hardware platform on which operation executes, and with which a user interacts.

In one embodiment, memory subsystem 830 includes lockstep PM set logic 880, which can locally set the crystalline state of a PM-based memory in accordance with any embodiment described herein. Some or all of memory 832 can be PCM. In one embodiment, one or more PCM memories are included in one or more other component subsystems of system 800. The PCMs can be set in accordance with a procedure that has separate stages for nucleation and crystal growth. Thus, logic 880 can heat the PCM to a first temperature for nucleation for a period of time, and then heat the PCM to a second temperature for growth for a period of time. Logic 880 is shown as being part of memory subsystem 830. However, in one embodiment, system 800 is a computing device that sets the state of a PCM storage media that is not part of the hardware platform of system 800. Thus, logic 880 can be part of a different subsystem, such as I/O interface 840 or peripheral interface 870, and logic 880 optically heats up a PM of an external medium.

Figure 9:
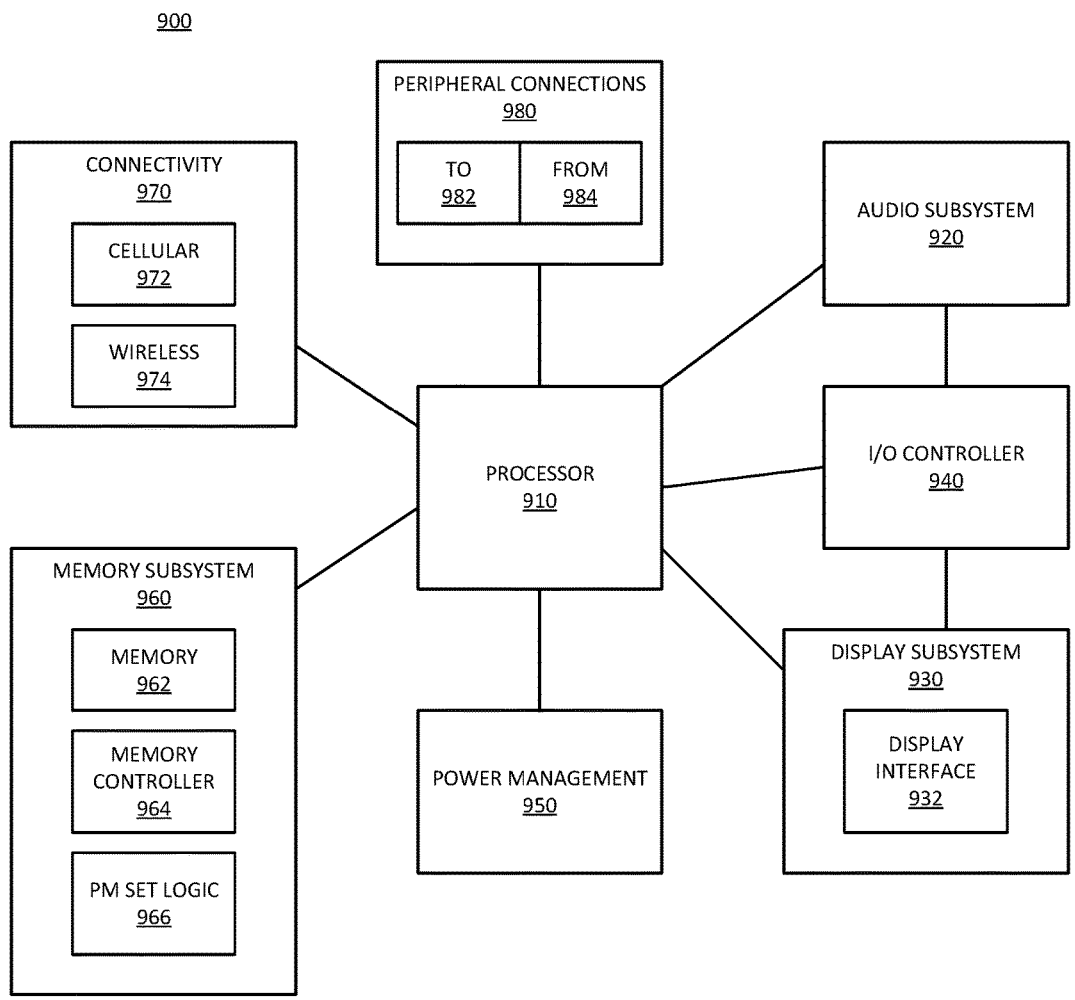
FIG. 9 is a block diagram of an embodiment of a mobile device in which a multistage phase change set procedure can be implemented.

FIG. 9 is a block diagram of an embodiment of a mobile device in which a multistage phase change set procedure can be implemented. Device 900 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 900.

Device 900 includes processor 910, which performs the primary processing operations of device 900. Processor 910 can include one or more physical devices, such as microprocessors, application processors, microcontrollers, programmable logic devices, or other processing means. The processing operations performed by processor 910 include the execution of an operating platform or operating system on which applications and/or device functions are executed. The processing operations include operations related to I/O (input/output) with a human user or with other devices, operations related to power management, and/or operations related to connecting device 900 to another device. The processing operations can also include operations related to audio I/O and/or display I/O.

In one embodiment, device 900 includes audio subsystem 920, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 900, or connected to device 900. In one embodiment, a user interacts with device 900 by providing audio commands that are received and processed by processor 910.

Display subsystem 930 represents hardware (e.g., display devices) and software (e.g., drivers) components that provide a visual and/or tactile display for a user to interact with the computing device. Display subsystem 930 includes display interface 932, which includes the particular screen or hardware device used to provide a display to a user. In one embodiment, display interface 932 includes logic separate from processor 910 to perform at least some processing related to the display. In one embodiment, display subsystem 930 includes a touchscreen device that provides both output and input to a user. In one embodiment, display subsystem 930 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others.

I/O controller 940 represents hardware devices and software components related to interaction with a user. I/O controller 940 can operate to manage hardware that is part of audio subsystem 920 and/or display subsystem 930. Additionally, I/O controller 940 illustrates a connection point for additional devices that connect to device 900 through which a user might interact with the system. For example, devices that can be attached to device 900 might include microphone devices, speaker or stereo systems, video systems or other display device, keyboard or keypad devices, or other I/O devices for use with specific applications such as card readers or other devices.

As mentioned above, I/O controller 940 can interact with audio subsystem 920 and/or display subsystem 930. For example, input through a microphone or other audio device can provide input or commands for one or more applications or functions of device 900. Additionally, audio output can be provided instead of or in addition to display output. In another example, if display subsystem includes a touchscreen, the display device also acts as an input device, which can be at least partially managed by I/O controller 940. There can also be additional buttons or switches on device 900 to provide I/O functions managed by I/O controller 940.

In one embodiment, I/O controller 940 manages devices such as accelerometers, cameras, light sensors or other environmental sensors, gyroscopes, global positioning system (GPS), or other hardware that can be included in device 900. The input can be part of direct user interaction, as well as providing environmental input to the system to influence its operations (such as filtering for noise, adjusting displays for brightness detection, applying a flash for a camera, or other features). In one embodiment, device 900 includes power management 950 that manages battery power usage, charging of the battery, and features related to power saving operation.

Memory subsystem 960 includes memory device(s) 962 for storing information in device 900. Memory subsystem 960 can include nonvolatile (state does not change if power to the memory device is interrupted) and/or volatile (state is indeterminate if power to the memory device is interrupted) memory devices. Memory 960 can store application data, user data, music, photos, documents, or other data, as well as system data (whether long-term or temporary) related to the execution of the applications and functions of system 900. In one embodiment, memory subsystem 960 includes memory controller 964 (which could also be considered part of the control of system 900, and could potentially be considered part of processor 910). Memory controller 964 includes a scheduler to generate and issue commands to memory device 962.

Connectivity 970 includes hardware devices (e.g., wireless and/or wired connectors and communication hardware) and software components (e.g., drivers, protocol stacks) to enable device 900 to communicate with external devices. The external device could be separate devices, such as other computing devices, wireless access points or base stations, as well as peripherals such as headsets, printers, or other devices.

Connectivity 970 can include multiple different types of connectivity. To generalize, device 900 is illustrated with cellular connectivity 972 and wireless connectivity 974. Cellular connectivity 972 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 974 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 980 include hardware interfaces and connectors, as well as software components (e.g., drivers, protocol stacks) to make peripheral connections. It will be understood that device 900 could both be a peripheral device ("to" 982) to other computing devices, as well as have peripheral devices ("from" 984) connected to it. Device 900 commonly has a "docking" connector to connect to other computing devices for purposes such as managing (e.g., downloading and/or uploading, changing, synchronizing) content on device 900. Additionally, a docking connector can allow device 900 to connect to certain peripherals that allow device 900 to control content output, for example, to audiovisual or other systems.

In addition to a proprietary docking connector or other proprietary connection hardware, device 900 can make peripheral connections 980 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, memory subsystem 960 includes lockstep PM set logic 966, which can locally set the crystalline state of a PM-based memory in accordance with any embodiment described herein. Some or all of memory 962 can be PCM. In one embodiment, one or more PCM memories are included in one or more other component subsystems of system 900. The PCMs can be set in accordance with a procedure that has separate stages for nucleation and crystal growth. Thus, logic 966 can heat the PCM to a first temperature for nucleation for a period of time, and then heat the PCM to a second temperature for growth for a period of time. Logic 966 is shown as being part of memory subsystem 930. However, in one embodiment, system 900 is a computing device that sets the state of a PCM storage media that is not part of the hardware platform of system 900. Thus, logic 966 can be part of a different subsystem, such as I/O controller 940 or peripheral connections 980, and logic 966 optically heats up a PM of an external medium.

In one aspect, a method in a phase change semiconductor material includes: heating a phase change semiconductor material (PM) to a first temperature for a first period of time to promote nucleation of a crystalline state of the PM; and increasing the PM from the first temperature to a second temperature for a second period of time, the second temperature to promote crystal growth within the PM to set the PM to the crystalline state.

In one embodiment, heating the PM comprises controlling an amount of current passing through the PM. In one embodiment, heating comprises controlling an intensity of laser light on the PM. In one embodiment, the first temperature for the first period of time to promote nucleation comprises a first nucleation temperature for a first sub-period of time and a second nucleation temperature for a second sub-period of time. In one embodiment, the method further comprising: initially heating the PM to a temperature higher than the first temperature to amorphize the PM prior to nucleation; and allowing the PM to cool to a temperature lower than the first temperature prior to heating to the first temperature. In one embodiment, the method further comprising: decreasing from the second temperature to a third temperature for a third period of time to anneal disturbance in the crystalline structure of the PM caused by overheating at the second temperature. In one embodiment, the PM is a storage cell of a phase change memory (PCM).

In one aspect, a circuit to set a chalcogenide material includes: a power source to heat a phase change chalcogenide material (PM); and a control circuit to control the power source, to heat the PM to a first temperature for a first period of time to promote nucleation of a crystalline state of the PM, and to increase the PM from the first temperature to a second temperature for a second period of time, the second temperature to promote crystal growth within the PM to set the PM to the crystalline state.

In one embodiment, the control circuit comprises a circuit coupled to the PM to control an amount of current passing through the PM. In one embodiment, the control circuit comprises a light source to control an intensity of laser light directed to the PM. In one embodiment, the first temperature for the first period of time to promote nucleation comprises a first nucleation temperature for a first sub-period of time and a second nucleation temperature for a second sub-period of time. In one embodiment, further comprising the control circuit to initially heat the PM to a temperature higher than the first temperature to amorphize the PM prior to nucleation, and allow the PM to cool to a temperature lower than the first temperature prior to heating to the first temperature. In one embodiment, further comprising the control circuit to decrease from the second temperature to a third temperature for a third period of time to anneal disturbance in the crystalline structure of the PM caused by overheating at the second temperature. In one embodiment, the PM is a storage cell of a phase change memory (PCM).

In one aspect, a system to implement a phase change set includes: a phase-change dynamic random access memory (PRAM) including a phase change material (PM); a power source to provide power to heat the PM; and a controller to write to the PRAM, the controller including a control circuit to control application of heat from the power source to the PM, the controller to heat the PM to a first temperature for a first period of time to promote nucleation of a crystalline state of the PM, and to increase the PM from the first temperature to a second temperature for a second period of time, the second temperature to promote crystal growth within the PM to set the PM to the crystalline state; and a touchscreen display coupled to generate a display based on data accessed from the PRAM.

In one embodiment, the controller is to control an amount of current passing through the PM. In one embodiment, the controller is to control an intensity of laser light directed to the PM. In one embodiment, the first temperature for the first period of time to promote nucleation comprises a first nucleation temperature for a first sub-period of time and a second nucleation temperature for a second sub-period of time. In one embodiment, further comprising the controller to initially heat the PM to a temperature higher than the first temperature to amorphize the PM prior to nucleation, and allow the PM to cool to a temperature lower than the first temperature prior to heating to the first temperature. In one embodiment, further comprising the controller to decrease from the second temperature to a third temperature for a third period of time to anneal disturbance in the crystalline structure of the PM caused by overheating at the second temperature.

In one aspect, an apparatus for setting a phase change semiconductor material includes: means for heating a phase change semiconductor material (PM) to a first temperature for a first period of time to promote nucleation of a crystalline state of the PM; and means for increasing the PM from the first temperature to a second temperature for a second period of time, the second temperature to promote crystal growth within the PM to set the PM to the crystalline state. The apparatus can include means for performing operations in accordance with any embodiment of the method set forth above.

In one aspect, an article of manufacture comprising a computer readable storage medium having content stored thereon, which when executed causes a machine to perform operation for setting a phase change semiconductor material, including: heating a phase change semiconductor material (PM) to a first temperature for a first period of time to promote nucleation of a crystalline state of the PM; and increasing the PM from the first temperature to a second temperature for a second period of time, the second temperature to promote crystal growth within the PM to set the PM to the crystalline state. The article of manufacture can include content for performing operations in accordance with any embodiment of the method set forth above.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory device, comprising:
a memory array including multiple memory cells of material that changes resistive state based on being in a crystalline state or a non-crystalline state, the memory cells having a thickness to cause a memory cell to be fully amorphized in all active areas of the memory cell in a non-crystalline state, and to lack sufficient crystal nuclei to promote crystal growth; and
interface circuitry coupled to the memory array to control access to the memory cells, including control to change a memory cell from the non-crystalline state to the crystalline state, including application of a nucleation temperature for a first period of time to create crystal nuclei, application of a crystal growth temperature higher than the nucleation temperature for a second period of time to promote crystal growth, and application of a termination temperature lower than the crystal growth temperature for a third period of time to set the crystalline state.

2. The memory device of claim 1, wherein the interface circuitry is to control application of the nucleation temperature, the crystal growth temperature, and the termination temperature through control of an amount of current passing through the memory cell.

3. The memory device of claim 2, wherein the interface circuitry includes a memory cell driver to control the amount of current passing through the memory cell.

4. The memory device of claim 1, wherein the interface circuitry is further to cause application of an initial temperature prior to the application of the nucleation temperature, the initial temperature higher than the nucleation temperature and higher than the crystal growth temperature.

5. The memory device of claim 4, wherein the interface circuitry is to cause application of the initial temperature for a period of time much shorter than the first period of time or the second period of time.

6. The memory device of claim 1, wherein the interface circuitry is to cause application of the nucleation temperature as multiple separate sub-temperatures for multiple separate sub-periods of time.

7. The memory device of claim 1, wherein the second period of time for crystal growth is at least twice as the first period of time for nucleation growth.

8. The memory device of claim 1, wherein the memory cell comprises a phase change memory (PCM) cell.

9. A memory controller, comprising:
read/write hardware to interface with a memory cell of a memory device having a memory array including multiple memory cells of material that changes resistive state based on being in a crystalline state or a non-crystalline state, the memory cells having a thickness to cause a memory cell to be fully amorphized in all active areas of the memory cell in the non-crystalline state, and to lack sufficient crystal nuclei to promote crystal growth; and
a scheduler to schedule a write command to the memory cell to change the memory cell from the non-crystalline state to the crystalline state, including control of timing to enable the change of the memory cell including application of a nucleation temperature for a first period of time to create crystal nuclei, application of a crystal growth temperature higher than the nucleation temperature for a second period of time to promote crystal growth, and application of a termination temperature lower than the crystal growth temperature for a third period of time to set the crystalline state.

10. The memory controller of claim 9, wherein the application of the nucleation temperature, the crystal growth temperature, and the termination temperature comprises application of different amounts of current passing through the memory cell.

11. The memory controller of claim 9, wherein the scheduler is to schedule the write command including control of timing to enable application of an initial temperature prior to the application of the nucleation temperature, the initial temperature higher than the nucleation temperature and higher than the crystal growth temperature.

12. The memory controller of claim 11, wherein application of the initial temperature comprises application for a period of time much shorter than the first period of time or the second period of time.

13. The memory controller of claim 9, wherein application of the nucleation temperature comprises application of multiple separate sub-temperatures for multiple separate sub-periods of time.

14. The memory controller of claim 9, wherein the second period of time for crystal growth is at least twice as the first period of time for nucleation growth.

15. The memory controller of claim 9, wherein the memory cell comprises a phase change memory (PCM) cell.

16. A system to implement a phase change set, comprising:
a memory controller; and
a dynamic random access memory (DRAM) device including
a memory array including multiple memory cells of material that changes resistive state based on being in a crystalline state or a non-crystalline state, the memory cells having a thickness to cause a memory cell to be fully amorphized in all active areas of the memory cell in a non-crystalline state, and to lack sufficient crystal nuclei to promote crystal growth; and
interface circuitry coupled to the memory array to control access to the memory cells, including control to change a memory cell from the non-crystalline state to the crystalline state, including application of a nucleation temperature for a first period of time to create crystal nuclei, application of a crystal growth temperature higher than the nucleation temperature for a second period of time to promote crystal growth, and application of a termination temperature lower than the crystal growth temperature for a third period of time to set the crystalline state.

17. The system of claim 16, wherein the interface circuitry is to control application of the nucleation temperature, the crystal growth temperature, and the termination temperature through control of an amount of current passing through the memory cell.

18. The system of claim 16, wherein the interface circuitry is further to cause application of an initial temperature prior to the application of the nucleation temperature, the initial temperature higher than the nucleation temperature and higher than the crystal growth temperature.

19. The system of claim 16, wherein the interface circuitry is to cause application of the nucleation temperature as multiple separate sub-temperatures for multiple separate sub-periods of time.

20. The system of claim 16, further comprising one or more of:
a processor device on which the memory controller is integrated;

a display communicatively coupled to at least one processor and to the DRAM device;
a battery to power the system; or
a network interface communicatively coupled to at least one processor and to the DRAM device.

* * * * *